United States Patent
Nikaido et al.

(10) Patent No.: US 7,777,263 B2
(45) Date of Patent: Aug. 17, 2010

(54) SEMICONDUCTOR INTEGRATED CIRCUIT DEVICE COMPRISING SRAM AND CAPACITORS

(75) Inventors: Hirofumi Nikaido, Kanagawa (JP); Seiji Hirabayashi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 539 days.

(21) Appl. No.: 11/345,311

(22) Filed: Feb. 2, 2006

(65) Prior Publication Data

US 2006/0170023 A1 Aug. 3, 2006

(30) Foreign Application Priority Data

Feb. 3, 2005 (JP) .............................. 2005-027230
Apr. 5, 2005 (JP) .............................. 2005-108252

(51) Int. Cl.
*H01L 27/108* (2006.01)

(52) U.S. Cl. ................ 257/296; 257/758; 257/E27.098; 257/E21.661; 257/E29.345; 257/E29.342; 257/E27.093

(58) Field of Classification Search ................ 257/296, 257/758, E27.098, E21.661, E29.345, E29.342, 257/E27.093

See application file for complete search history.

(56) References Cited

U.S. PATENT DOCUMENTS

| 6,097,103 | A | 8/2000 | Ishigaki | |
|---|---|---|---|---|
| 6,281,541 | B1* | 8/2001 | Hu | 257/306 |
| 6,730,950 | B1* | 5/2004 | Seshadri et al. | 257/295 |
| 6,762,444 | B2 | 7/2004 | Ootsuka et al. | |
| 2002/0012265 | A1* | 1/2002 | Tsuda et al. | 365/154 |
| 2002/0072172 | A1* | 6/2002 | Pai et al. | 438/254 |
| 2004/0109342 | A1* | 6/2004 | Fujino | 365/149 |
| 2004/0147086 | A1* | 7/2004 | Uhlenbrock et al. | 438/396 |

FOREIGN PATENT DOCUMENTS

| CN | 1223471 A | 7/1999 |
|---|---|---|
| JP | 05-167037 | 7/1993 |
| JP | 10-163440 | 6/1998 |
| JP | 11-163166 | 6/1999 |
| JP | 2002-324855 | 11/2002 |
| JP | 2003-007978 | 1/2003 |

OTHER PUBLICATIONS

Soon-Moon Jung, et al., "Soft Error Immune 0.46 um2 SRAM Cell with MIM Node Capacitor by 65nm CMOS Technology for Ultra High Speed SRAM", IEEE, 0-7803-7873-3/03, 2003.
Chinese Office Action dated Dec. 28, 2007 with English language translation.
Japanese Office Action dated Apr. 20, 2010 (with partial English translation).

* cited by examiner

*Primary Examiner*—Bradley K Smith
*Assistant Examiner*—Mohammad T Karimy
(74) *Attorney, Agent, or Firm*—McGinn IP Law Group, PLLC

(57) ABSTRACT

To provide a semiconductor integrated circuit device capable of increasing a capacitor capacitance. A semiconductor integrated circuit device according to an embodiment of the present invention includes: a circuit element formed on a semiconductor substrate; and capacitors formed on the semiconductor substrate and including: a lower capacitance electrode formed of a lower wiring line connected to the circuit element; a capacitance insulating film covering an upper surface and a side surface of the lower wiring line; and an upper capacitance electrode formed on the capacitance insulating film, the lower capacitance electrode including at least one of a power supply line and a ground line formed of the lower wiring line.

17 Claims, 14 Drawing Sheets

SEMICONDUCTOR INTEGRATED CIRCUIT DEVICE COMPRISING SRAM AND CAPACITORS

BACKGROUND OF THE INVENTION

1. Field of the Invention

The present invention relates to a semiconductor integrated circuit device having a capacitor as a capacitive element in a wiring structure. In particular, the invention relates to a semiconductor integrated circuit device suitably applicable to an SRAM (Static Random Access Memory) recording data in a capacitor.

2. Description of Related Art

In recent years, semiconductor integrated circuit devices have been designed to lower a power supply voltage down to about 1.0 to 2.1 V. Along with this tendency, an attempt has been made to finely set various element sizes or wiring line widths. For example, a memory cell size is reduced, and a wiring line connected with the memory is narrowed in the SRAM. Such reduction in line width and memory cell size is effective in terms of high-speed operation because a resistance value of a wiring line connecting between elements is reduced. Conversely, there is a possibility that a value of a parasitic capacitance of a wiring line increases to affect element characteristics. For example, an SRAM cell composed of six MOS transistors Q1 to Q6 of FIG. 14 stores data by use of parasitic capacitances (hereinafter, referred to as "node capacitances") of wiring lines N1 and N2 for cross-connecting between gate terminals and drain terminals of a pair of driving transistors Q3 and Q4 that turn on/off contrarily to each other (hereinafter, in this specification, the wiring lines N1 and N2 are referred to as "node wiring lines", and the node wiring lines imply a line connected with a node where drain terminals of a load transistor Q1 and the driving transistor Q3 are connected, and a line connected with a node where drain terminals of a load transistor Q2 and the driving transistor Q4 are connected). However, a diffusion layer (gate area) constituting the node capacitance is reduced as the memory cell size or line width is reduced. This reduces the node capacitance as well to incur a soft error. Incidentally, the term "soft error" means that data charges accumulated in a node capacitance escape toward a semiconductor substrate side when a memory cell is applied with α line or neutron beam, resulting in a data loss.

To overcome such a soft error, a technique disclosed in Japanese Unexamined Patent Publication No. 10-163440 aims at partially laminating respective node wiring lines (in the illustrated example of FIG. 14, node wiring lines N1 and N2) of a pair of driving transistors constituting a memory cell via an insulating layer. Then, a capacitor is formed in the laminated portion to thereby increase a parasitic capacitance of the node wiring lines, that is, the node capacitance. Hence, an amount of accumulated data charges increases along with the increase in node capacitance, so an SRAM that is highly resistant to the soft error can be obtained without increasing a memory size.

Further, a technique disclosed in Japanese Unexamined Patent Publication No. 2002-324855 aims at forming a trench in an insulating film formed on a semiconductor substrate and embedding a conductive film in the trench to form a node wiring line for the purpose of increasing a node capacitance. Further, Japanese Unexamined Patent Publication No. 2002-324855 discloses a technique of forming a plug-like first electrode in a part of the node wiring line, exposing an upper end of the first electrode by a desired height, and forming a capacitive insulating film and a second electrode to cover the exposed portion. With the technique of Japanese Unexamined Patent Publication No. 2002-324855, a capacitor is formed using upper and side surfaces of the first electrode, so an area of the capacitor opposing the second electrode can be increased, which is effective for increasing a node capacitance. In addition, the capacitive insulating film and the second electrode have the flat surface on the first electrode, making it possible to form the capacitive insulating film constituting the capacitor with a uniform thickness and improve a reliability of the capacitor.

With a similar technique as disclosed in Soft Error Immune 0.64 µm$^2$ SRAM Cell with MIM Node Capacitor by 65 nm CMOS Technology for Ultra High Speed SRAM 0-7803-7873-3/03/$17.00(c)2003IEEE (hereinafter, reffered to as non-patent document 1), a trench is formed between a pair of node wiring lines formed in an insulating film as in Japanese Unexamined Patent Publication No. 2002-324855. A capacitive insulating film covers the trench, and a conductive film as the second electrode is embedded in the trench, so a capacitor is formed between a pair of node wiring lines and the second electrode. With this technique, the second electrode is formed to cover a trench formed in the insulating film. Hence, no node wiring line protrudes from the insulating film, and this technique is effective for leveling the surface as compared with the technique of Japanese Unexamined Patent Publication No. 2002-324855.

The technique of Japanese Unexamined Patent Publication No. 10-163440 requires that node wiring lines of a pair of driving transistors be laminated. As a result, the node wiring lines of two layers should be laminated. Thus, a node wiring pattern should be changed as compared with an existing SRAM where both node wiring lines are formed in the same layer. Further, a step of forming a contact for connecting a node wiring line formed in an upper layer with a transistor is necessary to increase the number of steps. In addition, a capacitor is formed only at intersections of the two node wiring lines, so it is difficult to secure a large area for an opposing electrode, and limitations are imposed on an increase of the node capacitance.

With the technique of Japanese Unexamined Patent Publication No. 2002-324855, both the node electrodes of a pair of driving transistors are formed in the same layer, so a node capacitance can be increased without changing a node wiring pattern of the existing SRAM. Further, according to both the techniques of Japanese Unexamined Patent Publication No. 2002-324855 and Non-Patent Document 1, a capacitor is formed between the upper and side surfaces of the node wiring line and a second electrode formed to cover the upper and side surfaces. Hence, the above techniques are effective for increasing an area of the node wiring lines to increase a node capacitance of the capacitor. However, according to both the techniques of Japanese Unexamined Patent Publication No. 2002-324855 and Non-Patent Document 1, a capacitor is formed only using the node wiring lines and the second electrode. Thus, an area of the capacitor opposing the electrode, which influences a node capacitance, depends on an area of the node wiring lines. Thus, in the case of reducing the node line width, the area of the capacitor opposing the electrode is reduced, whish is disadvantageous in terms of increasing the node capacitance. Further, according to the technique of Non-Patent Document 1, a second electrode is formed only in a part of the memory cell, so there is a difference in height between the area having the second electrode and the rest. There is a fear that disconnection of a wiring line formed in an upper layer occurs. In particular, if plural second electrodes are independently formed in one memory cell, a difference in height occurs between the respective second electrodes and their peripheral portions, and the total length thereof is considerably long.

Further, after the production of a semiconductor integrated circuit device, various characteristic inspections are executed. For example, in the case of executing a CDM (Charged Device Model) inspection to inspect with stand voltage, the semiconductor integrated circuit device is charged with generated static electricity. Thus, the SRAM obtained by forming a capacitance electrode in the node wiring lines via a thin capacitance insulating film to give a node capacitance is charged. Furthermore, the capacitance electrode is simultaneously charged to incur discharge with node wiring lines, power supply lines, or ground lines, with the result that the capacitance insulating film suffers an electrostatic discharge damage. The electrostatic discharge damage of the capacitance insulating film causes short-circuiting between the capacitance electrode and the node wiring lines to disable the operation of the SRAM. Even if not short-circuited, the node capacitance is lost to lower the foregoing resistance to soft error.

SUMMARY OF THE INVENTION

A semiconductor integrated circuit device according to an aspect of the invention includes: a circuit element formed on a semiconductor substrate; and a plurality of capacitors formed on the semiconductor substrate, each of the capacitors including: a lower capacitance electrode formed of a lower wiring line connected to the circuit element; a capacitance insulating film covering an upper surface and a side surface of the lower wiring line; and an upper capacitance electrode formed on the capacitance insulating film, the lower capacitance electrode including at least one of a power supply line and a ground line formed of the lower wiring line. According to the device of the present invention, a capacitor if formed using upper and side surfaces of the lower capacitance electrode formed of a lower wiring line, and a power supply line or ground line is used as the lower capacitance electrode, whereby a capacitor capacitance can be increased.

According to a semiconductor integrated circuit device of the present invention, a capacitor capacitance can be increased.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A semiconductor integrated circuit device according to the present invention includes a circuit element and capacitor formed on a semiconductor substrate. The capacitor includes a lower capacitance electrode composed of a lower wiring line connected with the circuit element, a capacitance insulating film covering upper and side surfaces of the lower wiring line, and an upper capacitance electrode formed on the capacitance insulating film. Further, the lower capacitance electrode includes at least one of a power supply line or ground line formed of the lower wiring line. In the case of applying the semiconductor integrated circuit device according to the present invention to an SRAM, the upper capacitance electrode is formed over a memory cell region except for a portion for electrical connection with the upper wiring line. Further, when plural memory cells are arranged on the semiconductor substrate, the upper capacitance electrode extends over an adjacent memory cell. Further, in the SRAM according to the present invention, at least one memory cell and a well contact cell are disposed in one line, the well contact cell is configured to connect the memory cell with the power supply line and ground line composed of the upper wiring line. The lower power supply line and lower ground line extend up to the well contact cell and are electrically connected with a power supply line or ground line there.

Moreover, it is possible to provide the semiconductor integrated circuit device of the present invention with a protective element. The protective element is composed of a MOS transistor, a bipolar transistor, or a diode formed together with a transfer transistor, a driving transistor, and a load transistor constituting the SRAM. In addition, the protective element is provided on at least one side of a memory cell array where memory cells and a well contact cell are arranged in one direction. That is, the momory cell array include a plurality of memory cell lines where memory cells and a well contact cell are arranged in one direction, and the protective element is provided on at least one side of a memory cell line. In this case, protective elements are connected with memory cell lines in a one-to-one correspondence. Alternatively, the protective element may be commonly connected with plural memory cell lines.

First Embodiment

Figure 1:
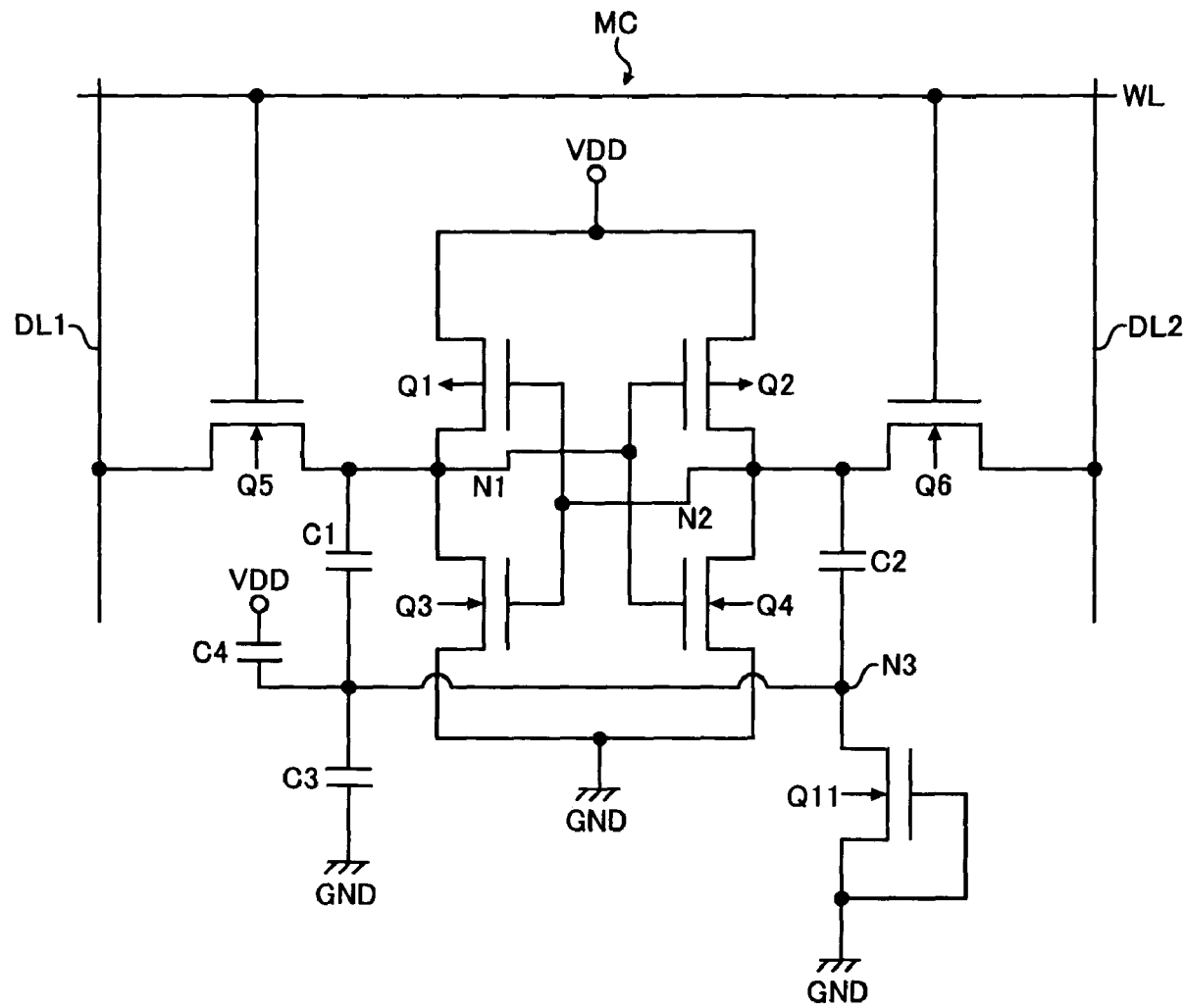
FIG. 1 is an equivalent circuit diagram of an SRAM according to an embodiment of the present invention.

Next, an embodiment of the present invention is described with reference to the accompanying drawings. FIG. 1 is an equivalent circuit diagram of an SRAM according to the embodiment of the present invention, which is composed of six MOS transistors Q1 to Q6. As shown in FIG. 1, two digit lines DL1 and DL2 intersect one word line WL, and a memory cell MC is defined at the intersections. The memory cell MC includes load transistors Q1 and Q2 respectively composed of P-channel MOS transistor, driving transistors Q3 and Q4 respectively composed of N-channel MOS transistor, and transfer transistors Q5 and Q6 respectively composed of N-channel MOS transistor and transferring data to the digit lines DL1 and DL2. Then, the load transistors Q1 and Q2 have source terminals connected with a power supply VDD, drain terminals respectively connected with drain terminals of the driving transistors Q3 and Q4, gates respectively connected with gates of the driving transistors Q3 and Q4. In addition, source terminals of the driving transistors Q3 and Q4 are connected with a ground GND. A drain terminal of the driving transistor Q3 is connected with a gate of the driving transistor Q4 via anode wiring line N1, and a drain terminal of the driving transistor Q4 is connected with a gate of the driving transistor Q3 via a node wiring line N2. The drain terminals of the driving transistors Q3 and Q4 are connected with the digit lines DL1 and DL2 via the transfer transistors Q5 and Q6, respectively. Each gate of the transfer transistors Q5 and Q6 is connected with the word line WL. Further, the node wiring lines N1 and N2 are connected with capacitors C1 and C2 as a node capacitance. Capacitors C3 and C4 are connected between the ground GND and the power supply VDD in relation to the capacitors C1 and C2. That is, the capacitor C3 is connected between the capacitor C1 and the ground GND, and the capacitor C4 is connected between the capacitor C1 and the power supply VDD. Likewise, the capacitor C3 is connected between the capacitor C2 and the ground GND, and the capacitor C4 is connected between the capacitor C2 and the power supply VDD.

Figure 2A:
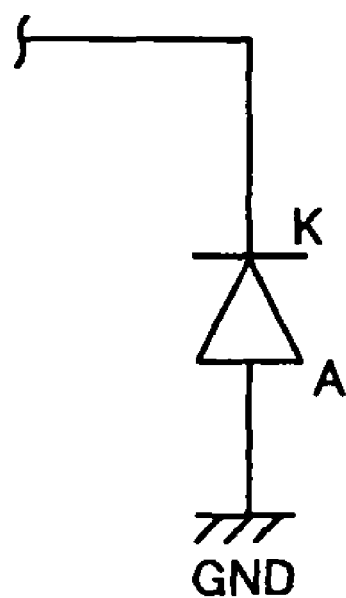
FIG. 2A shows an example of a protective element used in the SRAM according to the embodiment of the present invention.
Figure 2B:
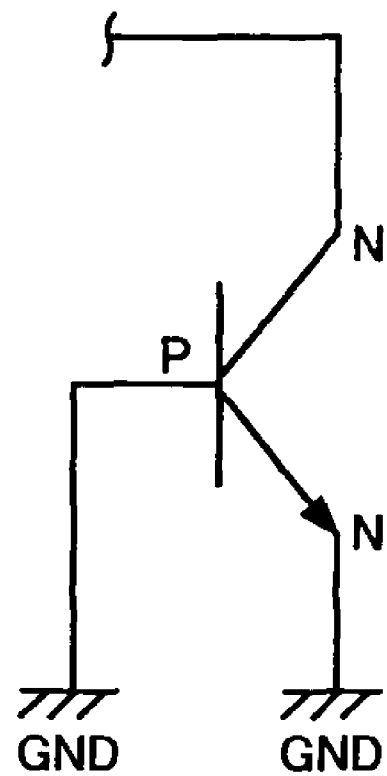
FIG. 2B shows another example of the protective element used in the SRAM according to the embodiment of the present invention.

Further, a protective element is connected between the ground GND and a node N3 connected with the capacitors C1 and C2 and the capacitors C3 and C4. The protective element is composed of an N-channel MOS transistor Q11. The MOS transistor Q11 has a drain connected with the node N3, and a gate and source connected with the ground GND. The protective element is a diode as shown in FIG. 2A, or diode-connection of NPN-type bipolar transistors as shown in FIG. 2B.

Figure 3A:
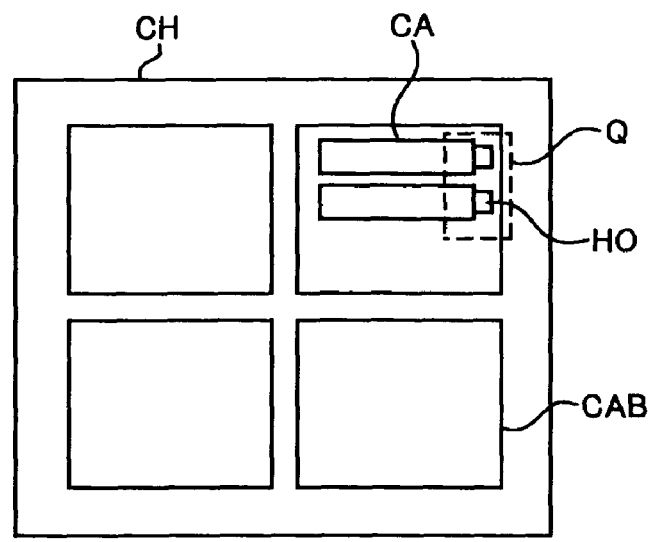
FIG. 3A shows a layout example of an overall semiconductor chip including the SRAM according to the embodiment of the present invention.

FIG. 3A shows the layout of the entire semiconductor chip CH including the SRAM of the present invention. Here, in the semiconductor chip CH, plural cell array blocks CAB are arranged. In each cell array block CAB, plural cell arrays CA are arranged. In each cell array CA, the memory cell MC and a well contact cell TU are arranged as mentioned below.

Further, a protective portion HO including the protective element is provided at the end of each cell array CA in each cell array block CAB.

Figure 4:
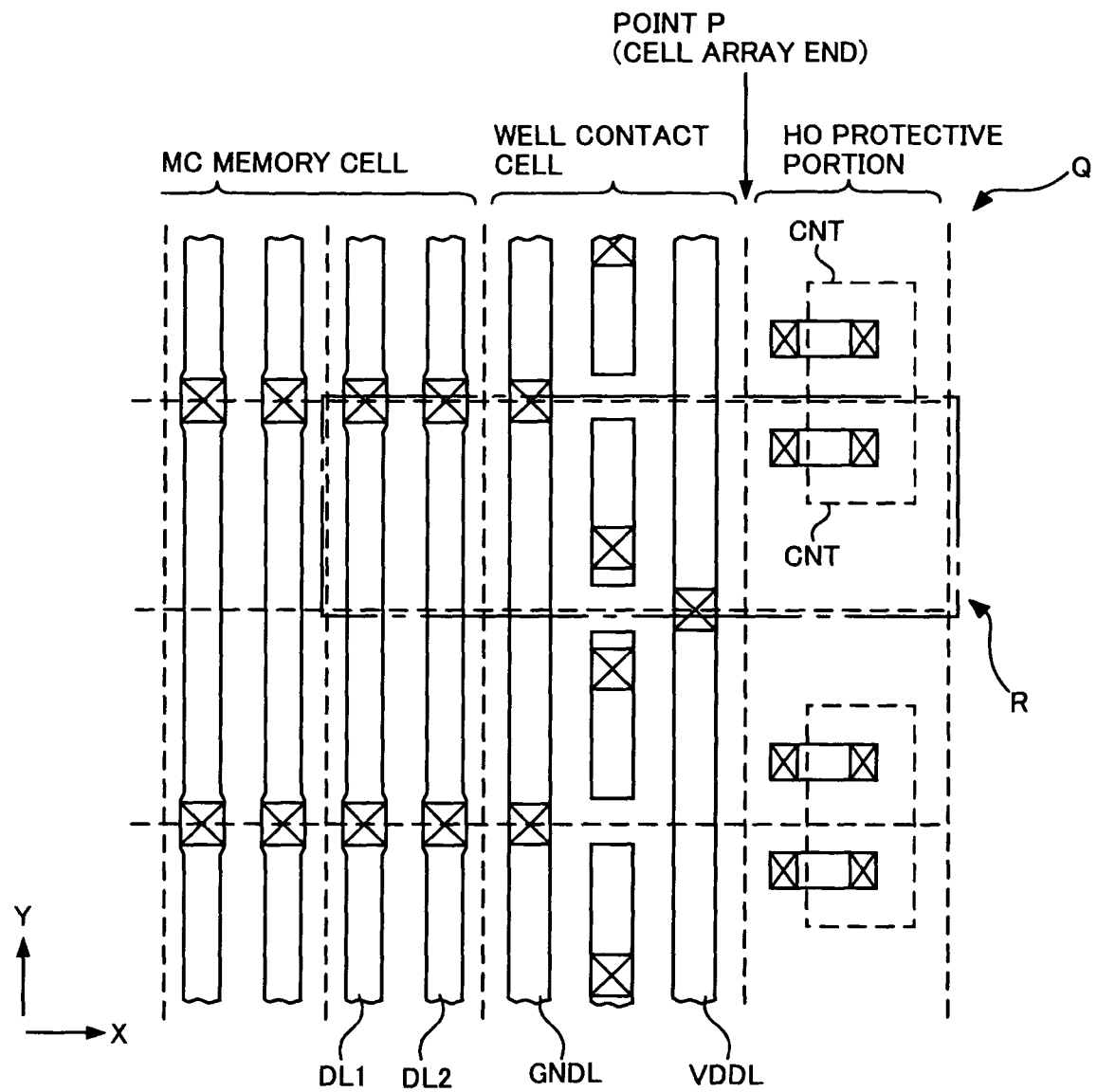
FIG. 4 is an enlarged view of a region Q shown in FIG. 3A.

FIG. 4 shows the layout of a part of the cell arrays CA, and illustrates a region corresponding to a portion surrounded by the broken line Q of FIG. 3A. The cell array CA includes a number of memory cells MC arranged in matrix and extending in the X and Y directions. Further, the well contact cell TU is arranged in the X direction of each memory cell MC to connect each of the plural memory cells MC with the power supply VDD, and the ground GND. In the illustrated example, the well contact cell TU is provided at one end of the cell array CA. On each memory cell MC, the pair of digit lines DL1 and DL2 extend in the Y direction. On the well contact cell TU, one power supply line VDDL and one ground line GNDL extend along the Y direction. Although the word line WL of FIG. 1 is omitted from FIG. 4, a polysilicon-made word line extends in the X direction in a lower layer region, and in addition, a metal-made word line electrically continuous with the word line of the lower layer extends in the X direction in an upper layer region.

A detailed description is next given of one memory cell MC, one well contact cell TU thereof, and a protective portion HO provided at one end of the cell array CA in the region R surrounded by alternate long and short dash lines of FIG. 4 in the cell array CA of the SRAM. Incidentally, a border between the well contact cell TU and the protective portion HO also implies a border between the cell array CA and the protective portion and is denoted by a point P in FIG. 4. FIGS. 5 to 8 each show the layout of a diffusion layer, a gate layer, a first wiring layer, a capacitance electrode layer, and a second wiring layer of the memory cell MC, the well contact cell TU, and the protective portion HO. FIGS. 9 to 12 are sectional views taken along the line A-A', the line B-B', the C-C', and the line D-D' of FIG. 8, respectively.

Figure 5:
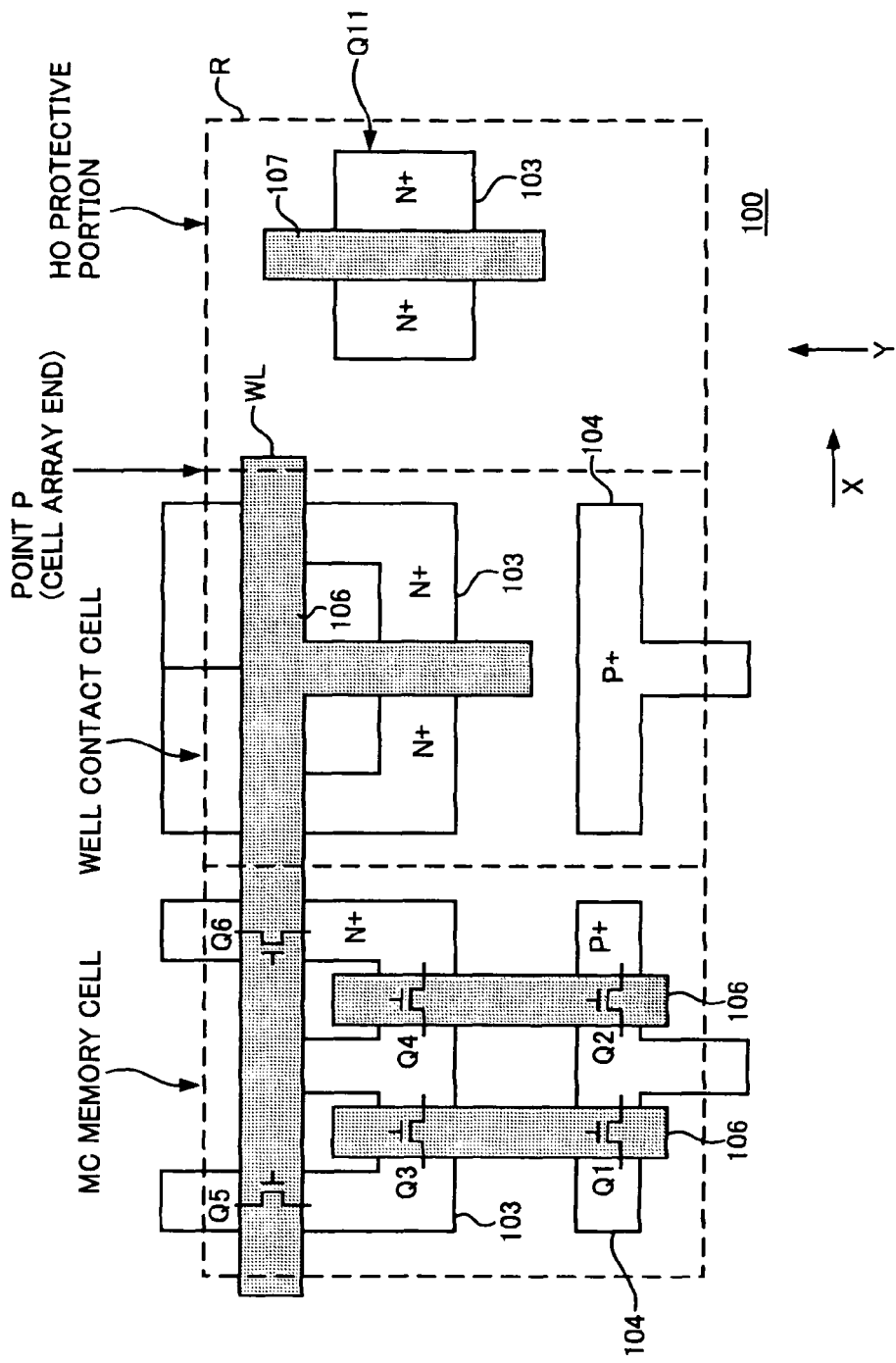
FIG. 5 shows the layout of a diffusion layer and a gate electrode in a region R of FIG. 4.

FIG. 5 is a plan view showing a diffusion layer and a gate layer. An N-type diffusion layer 103, a P-type diffusion layer 104, and a gate electrode 106 are used to form the N-channel MOS transistors Q3 to Q6 and the P-channel MOS transistors Q1 and Q2 in the memory cell MC. In the well contact cell TU, although the gate electrode 106 partially crosses the N-type diffusion layer 103, no transistor is formed at the intersection. Further, in the protective portion HO, the N-channel MOS transistor Q11 as a protective element composed of the N-type diffusion layer 103 and a gate electrode 107 is formed. The configuration of FIG. 5 is described with reference to sectional views of FIGS. 9 to 12. A field insulating film 101 is formed in the silicon substrate 100. The N-type diffusion layer 103 and the P-type diffusion layer 104 are formed in regions surrounded by the field insulating film 101. In this embodiment, a P-type well 102 is formed in the N-type silicon substrate 100, and the N-type diffusion layer 103 is formed in the P-type well 102. Needless to say, a P-type silicon substrate may be used. A thin silicon oxide film is formed on the surface of the silicon substrate 100, and a polysilicon film is formed thereon. Then, these films are patterned into a desired shape to form the gate insulating film 105 and the gate electrode 106. That is, the silicon oxide film is patterned to form the gate insulating film 105, and the polysilicon film is patterned to form the gate electrode 106. Further, in this embodiment, side walls 106a are formed on both sides of the gate electrode 106, and the MOS transistor has an LDD structure. However, for ease of explanation, an LDD layer is omitted from the drawings. In the memory cell MC, the six MOS transistors Q1 to Q6 are thus formed using each diffusion layer and the gate electrode. The MOS transistor Q11 is formed in the protective portion HO concurrently with the formation of the MOS transistors Q1 to Q6.

Further, gate electrodes of the transfer transistors Q5 and Q6 extend in the X direction as the word lines WL. The word line WL crosses the well contact cell TU in the X direction.

Figure 6:
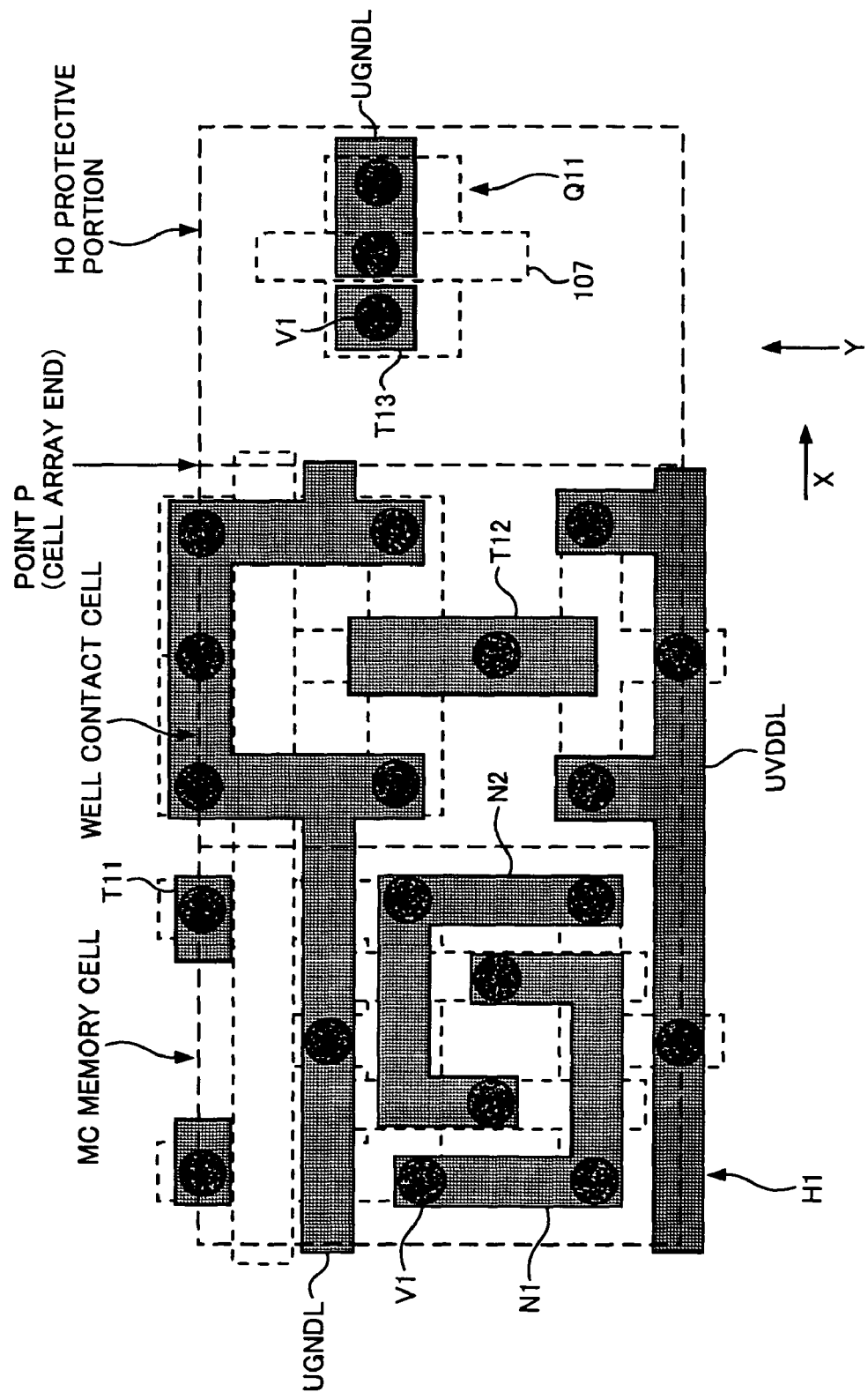
FIG. 6 shows the layout of a first wiring layer in the region R of FIG. 4.

FIG. 6 is a plan view showing the first wiring layer. Plural via holes V1 are formed for the connection with the MOS transistors Q1 to Q6, and Q11. A first wiring layer H1 connected through the first via hole V1 is formed into a desired pattern. The structure of FIG. 6 is described with reference to sectional views of FIGS. 9 to 12. A first interlayer insulating film 111 is formed over the gate electrode 106 and the gate electrode 107 of FIG. 5. In the interlayer insulating film 111, the plural first via hole V1 are formed to reach the diffusion layers 103 and 104, and the gate electrode in the well contact cell TU. The first via hole V1 is formed by forming a barrier metal film 112 made of TiN (titanium nitride) in a through-hole passing through the interlayer insulating film 111, burying wiring metal 113 such as W (tungsten) thereinto, and subjecting its surface to planarization based on a chemical-mechanical polishing (CMP) method so as to be flush with the surface of the interlayer insulating film 111. A second interlayer insulating film 121 is further formed thereon. The first wiring layer Hi of FIG. 4 is formed on the second interlayer insulating film 121.

The first wiring layer H1 is formed as a so-called buried wiring layer. The first wiring layer H1 is prepared by burying the barrier metal film 122 made of TiN and the wiring metal 123 such as W into a groove formed into a desired pattern throughout almost the entire thickness of the second interlayer insulating film 121. Referring to FIG. 6, the first wiring layer H1 partially forms the node wiring lines N1 and N2 for interconnecting the source terminals, the drain terminals, and the gates of the transistors Q1 to Q6 in the memory cell MC. That is, the first wiring layer H1 is formed as the first node wiring line N1 for connecting source terminals of the load transistor Q1, driving transistor Q3, and transfer transistor Q5 with a gate of the transfer transistor Q4. Furthermore, the first wiring layer H1 is formed as the second node wiring line N2 for connecting source terminals of the load transistor Q2, the transfer transistor Q4, and the transfer transistor Q6 with a gate of the driving transistor Q3. Another part of the first wiring layer H1 forms a lower power supply line UVDDL and a lower ground line UGNDL. Still another part of the first wiring layer H1 forms a relay electrode T11 electrically connected with the digit lines DL1 and DL2 in the top layer as mentioned below.

Meanwhile, as shown in FIG. 6, in the well contact cell TU, the first wiring layer H1 partially forms the lower power supply line UVDDL and lower ground line UGNDL extending from the memory cell MC. Another part of the first wiring layer H1 forms a relay electrode T12 electrically connected with an upper metal word line not shown in FIG. 6. In the protective portion HO, a part of the first wiring layer H1 forms the lower ground line UGNDL extending to the gate electrode 107 and a source (N-type diffusion layer 103), and another part thereof forms a relay electrode T13 extending to the drain (N-type diffusion layer 103) of the MOS transistor Q11.

Figure 7:
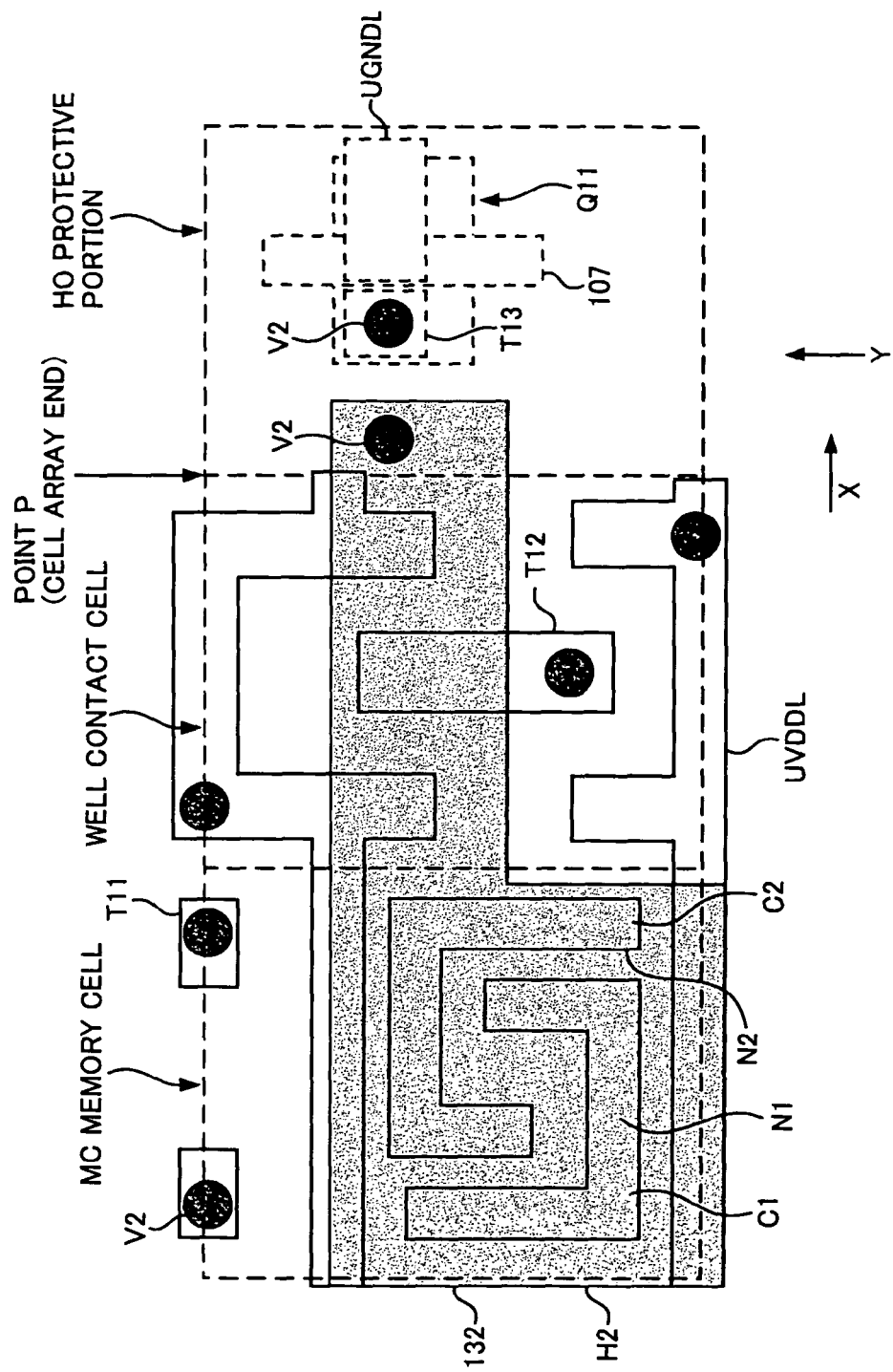
FIG. 7 shows the layout of a capacitance electrode layer in the region R of FIG. 4.

FIG. 7 is a plan view showing the second wiring layer. The structure of FIG. 7 is described with reference to sectional views of FIGS. 9 to 12. The upper surface and upper side surface of the first wiring layer H1 formed of the barrier metal film 122 and the wiring metal 123 are exposed from the second interlayer insulating film 121. A thin capacitance insulating film 131 made of silicon nitride is formed over the surface from which the first wiring layer H1 is exposed. In this way, the first wiring layer H1 is covered with the capacitance insulating film 131. Further, the second wiring layer H2 made of high-melting-point metal such as W is formed with a desired pattern on the capacitance insulating film 131. The second wiring layer H2 on the capacitance insulating film 131 is used to form an upper capacitance electrode 132. The second wiring layer H2 is formed with the thickness much larger than the exposed portion of the first wiring layer H1. Thus, the upper capacitance electrode 132 completely fills a recess formed between the patterns of the first wiring layer H1, and is almost leveled. The second wiring layer H2, that is, the upper capacitance electrode 132 is formed to cover almost the all region of the memory cell MC but a region including the relay electrode T11. In addition, in the well contact cell TU, the upper capacitance electrode 132 is formed not to interfere with the second via hole V2 connected with the power supply line VDDL in the top layer as mentioned below. Further, a part of the second wiring layer H2 extends up to the protective portion HO.

Figure 13A:
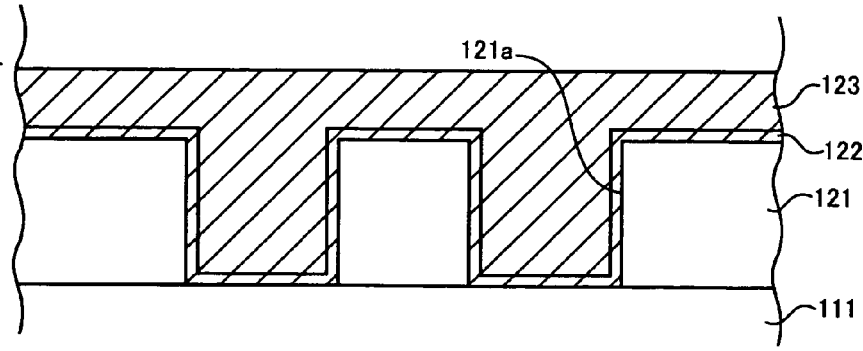
FIG. 13A is a sectional view showing a step in a manufacturing process for a capacitor.
Figure 13B:
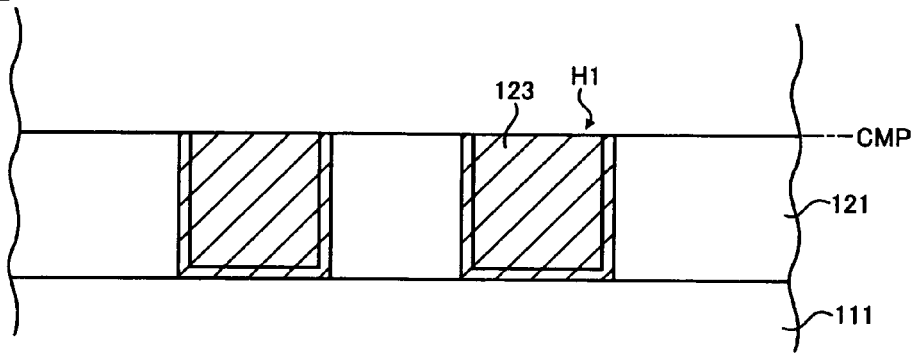
FIG. 13B is a sectional view showing a step in the manufacturing process for a capacitor.
Figure 13C:
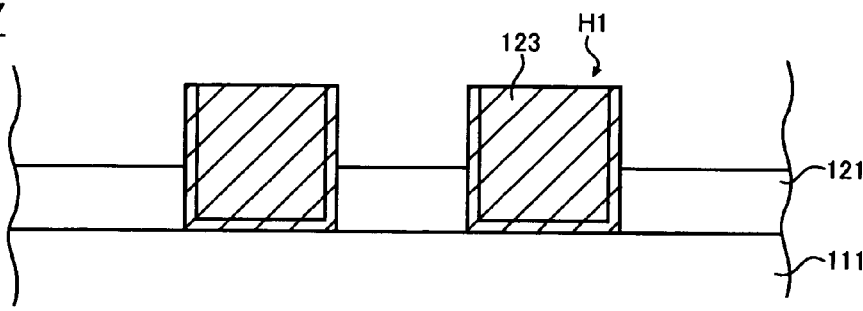
FIG. 13C is a sectional view showing a step in the manufacturing process for a capacitor.
Figure 13D:
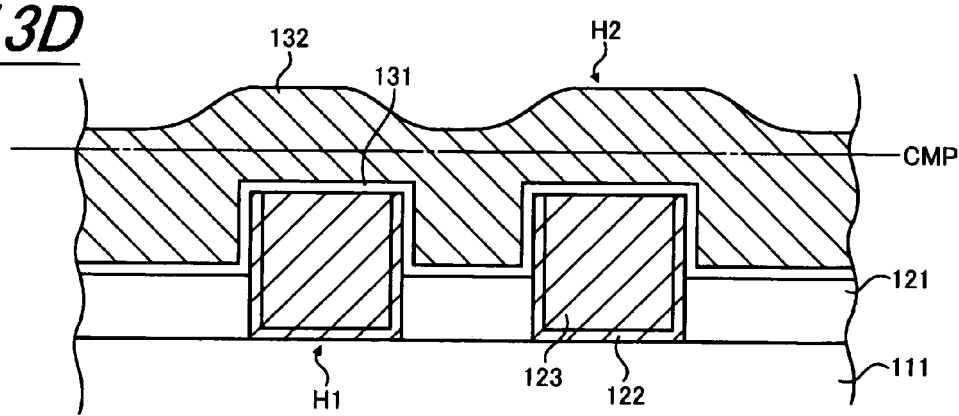
FIG. 13D is a sectional view showing a step in the manufacturing process for a capacitor.
Figure 14:
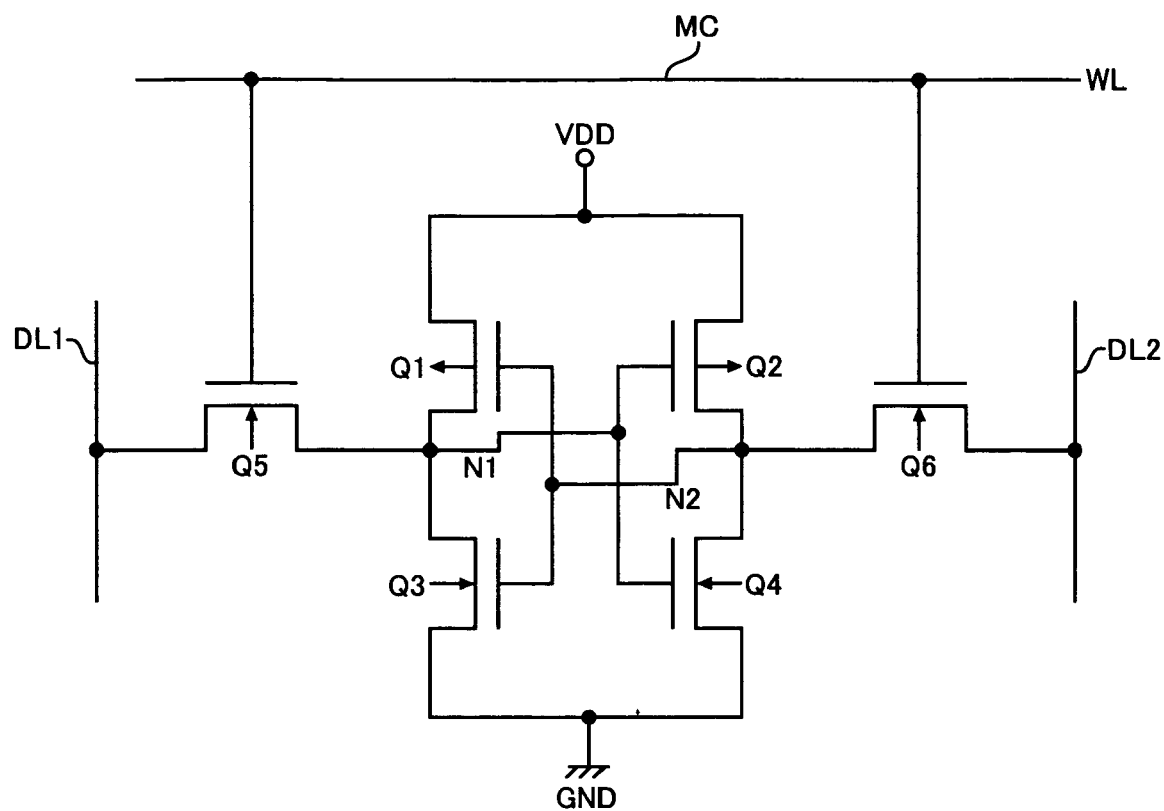
FIG. 14 is an equivalent circuit diagram showing a conventional SRAM.

Now, a manufacturing process for the first wiring layer H1, the capacitance insulating film 131, and the second wiring layer H2 (upper capacitance electrode 132) is described in brief. As shown in FIG. 13A, a groove 121a of a desired pattern is formed throughout almost the entire thickness of the second interlayer insulating film 121. The barrier metal film 122 made of TiN is formed to cover the surface of the groove. Then, the wiring metal 123 made of W is buried into the groove. The barrier metal film 122 is subjected to planarization based on the CMP method so as to be flush with the surface of the second interlayer insulating film 121. In this way, as shown in FIG. 13B, the first wiring layer H1 buried in the second interlayer insulating film 121 is prepared. Thereafter, as shown in FIG. 13C, the second interlayer insulating film 121 is etched to a desired depth to expose an upper portion of the first wiring layer H1 from the second interlayer insulating film 121. As a result, the upper surface and upper side surface of the first wiring layer H1 are exposed. Then, a silicon nitride film is formed based on the CVD method with a desired thickness over the entire surface to form the capacitance insulating film 131. Further, as shown in FIG. 13D, a W film is formed through sputtering on the capacitance insulating film 131 to form the second wiring layer H2. The second wiring layer H2 is formed with a thickness much larger than the exposed portion of the first wiring layer H1. The formed W film completely fills a recess between the patterns of the first wiring layer H1. After that, the second wiring layer H2 and the capacitance insulating film 131 underlying the second wiring layer are selectively etched into a desired pattern. If needed, the surface of the second wiring layer H2 is polished based on the CMP method as indicated by the broken line of FIG. 13D and is thus leveled. A portion beyond the broken line of FIG. 13D is thereby removed to obtain a flat surface.

In a region having the second wiring layer H2, a capacitor is formed with the upper capacitance electrode 132 as the second wiring layer H2, the capacitance insulating film 131 underlying the upper capacitance electrode, and the first wiring layer H1 underlying the capacitance insulating film 131. That is, the capacitor includes the upper capacitance electrode 132, the first wiring layer H1, and the capacitance insulating film 131 interposed therebetween. The capacitor C1 is formed in the first wiring layer H1 serving as the node wiring line N1. The capacitor C2 is formed in the first wiring layer H1 serving as the node wiring line N2. Further, the capacitor C3 is formed in the first wiring layer H1 serving as the lower ground line UGNDL. The capacitor C4 is formed in the first wiring layer H1 serving as the lower power supply line UVDDL. As shown in FIG. 1, the node wiring lines N1 and N2 are thus connected with the capacitors C1 and C2. Further, the capacitors C1 and C2 are series-connected with the capacitors C3 and C4 via the second wiring layer H2. That is, the capacitor C3 is provided between the capacitor C1 and the lower ground line UGNDL, and the capacitor C4 is provided between the capacitor C1 and the lower power supply line UVDDL. Further, the capacitor C3 is provided between the capacitor C2 and the lower ground line UGNDL, and the capacitor C4 is provided between the capacitor C2 and the lower power supply line UVDDL. In other words, the capacitor C3 is formed between the capacitor C1 and the ground line GND via the lower ground line UGNDL, and the capacitor C4 is formed between the capacitor C1 and the power supply line VDD via the lower power supply line UVDDL. Likewise, the capacitor C3 is formed between the capacitor C2 and the ground line GND via the lower ground line UGNDL, and the capacitor C4 is formed between the capacitor C2 and the power supply line VDD via the lower power supply line UVDDL.

Referring back to FIG. 7, the second via hole V2 is formed on the second wiring layer H2. The second via hole V2 is positioned above the relay electrode T11 in the memory cell MC. Further, the second via hole V2 is formed on the relay electrode T12, the lower power supply line UVDDL, and the lower ground line UGNDL in the well contact cell TU. The second via hole V2 is formed on the extended portion of the second wiring layer H2 and the relay electrode T13 in the protective portion HO. As shown in FIGS. 9 to 12, a third interlayer insulating film 141 is formed on the second wiring layer H2. The second via hole V2 is formed in the third interlayer insulating film 141. The second via hole V2 is prepared by covering the surface of a through-hole formed in the third interlayer insulating film 141 with the barrier metal film 142 made of TiN and burying the wiring metal 143 such as W thereinto and flattening the film so as to be flush with the third interlayer insulating film 141.

Figure 8:
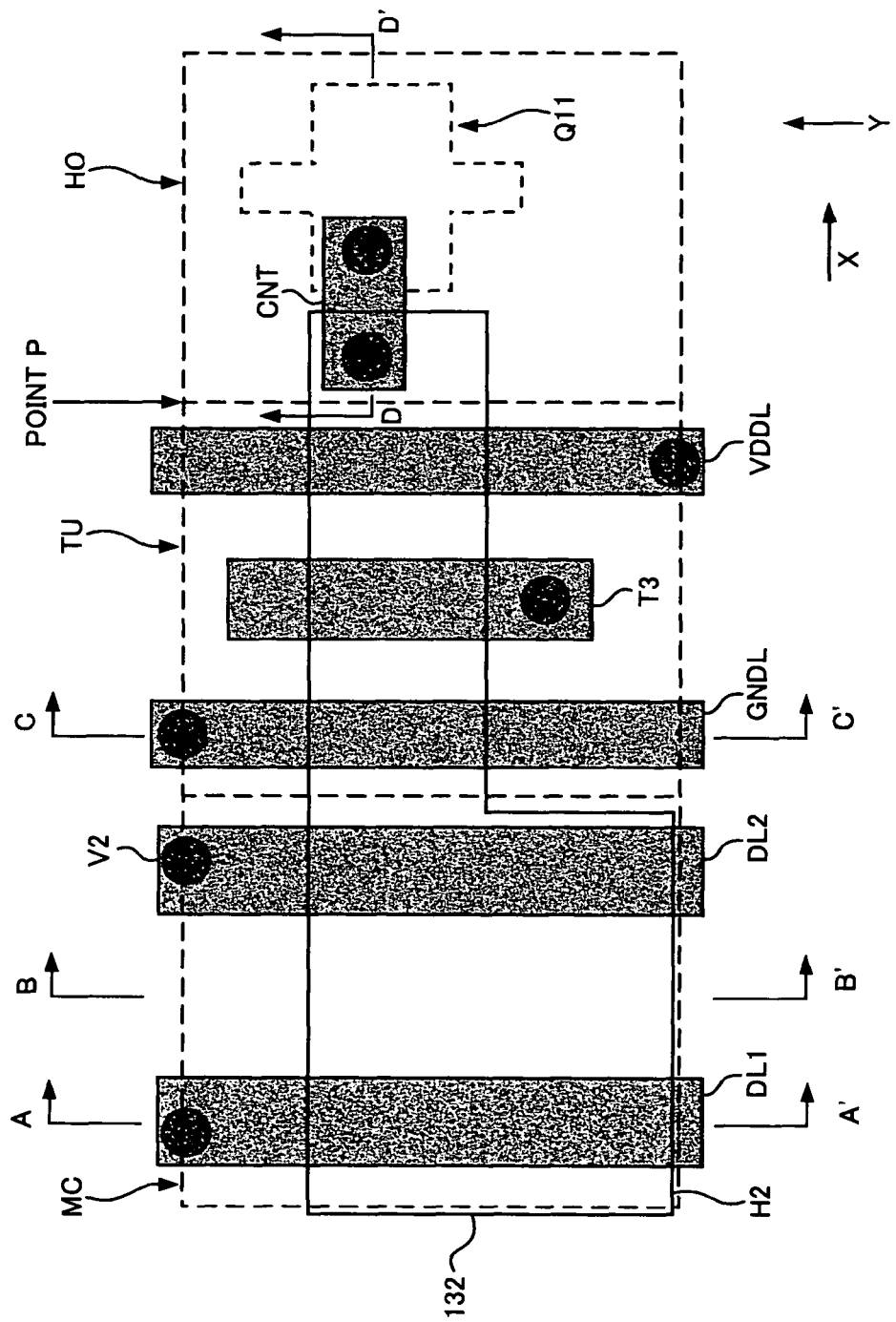
FIG. 8 shows the layout of a second wiring layer in the region R of FIG. 4.
Figure 9:
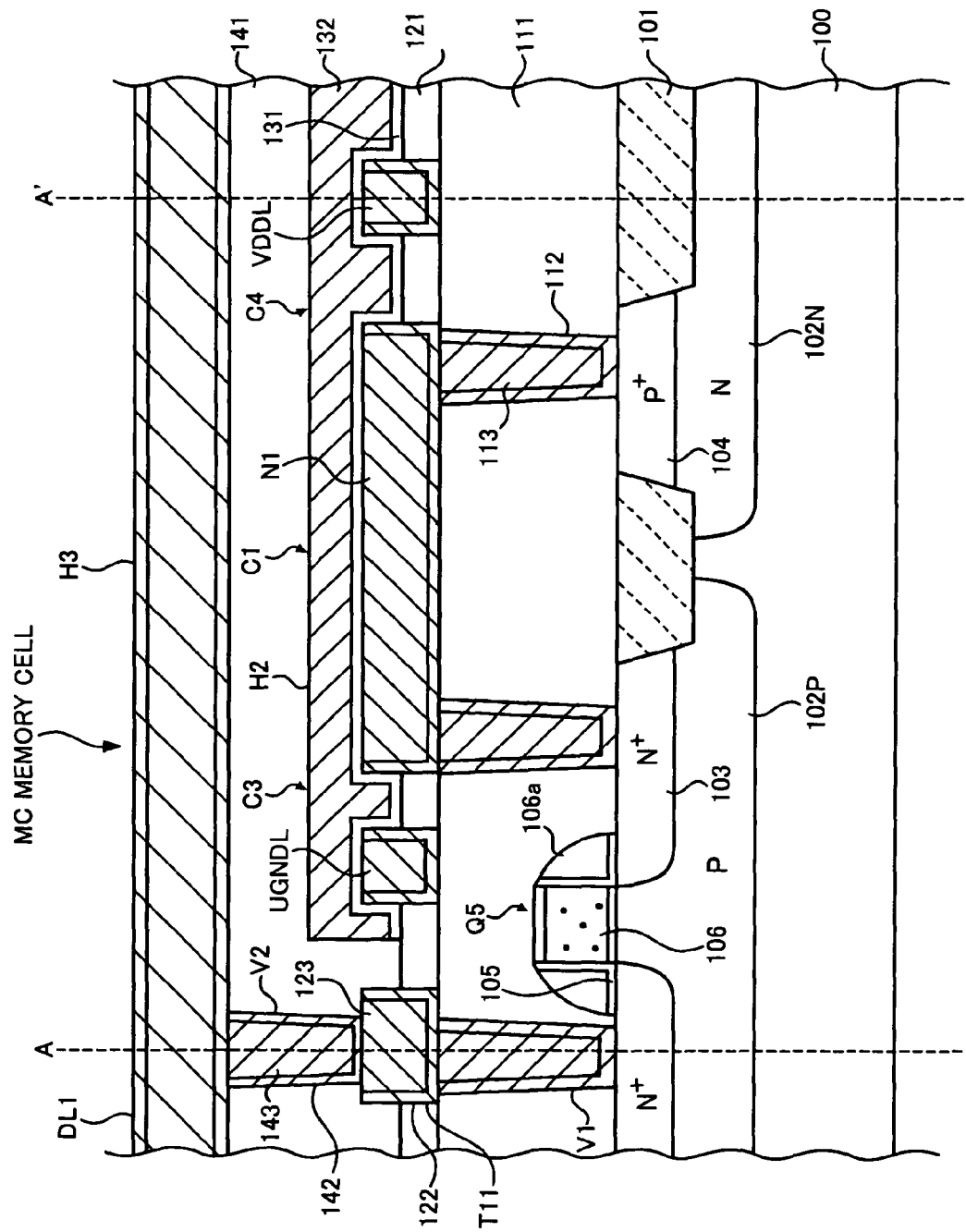
FIG. 9 is a sectional view taken along the line A-A' of FIG. 8.
Figure 10:
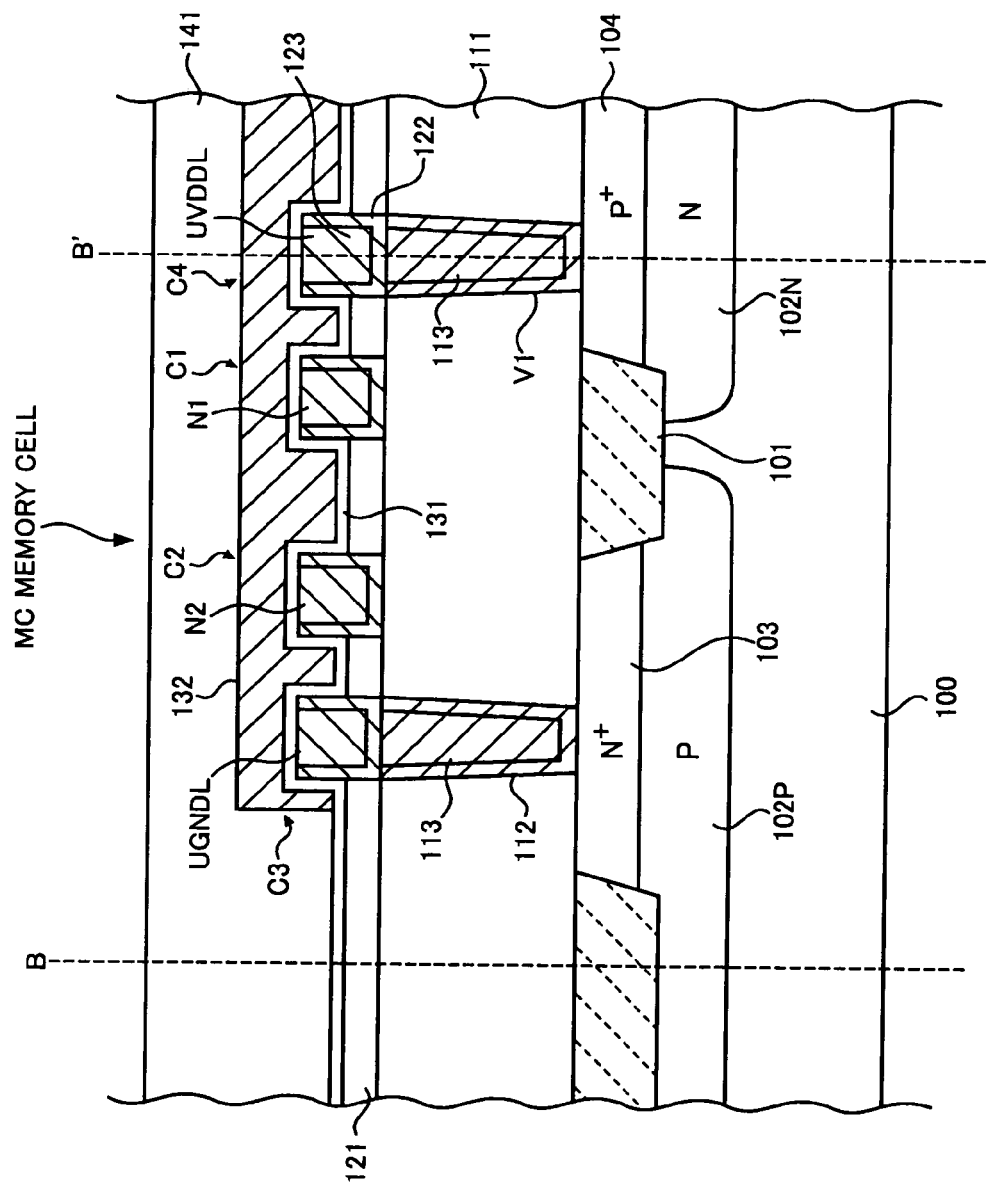
FIG. 10 is a sectional view taken along the line B-B' of FIG. 8.
Figure 11:
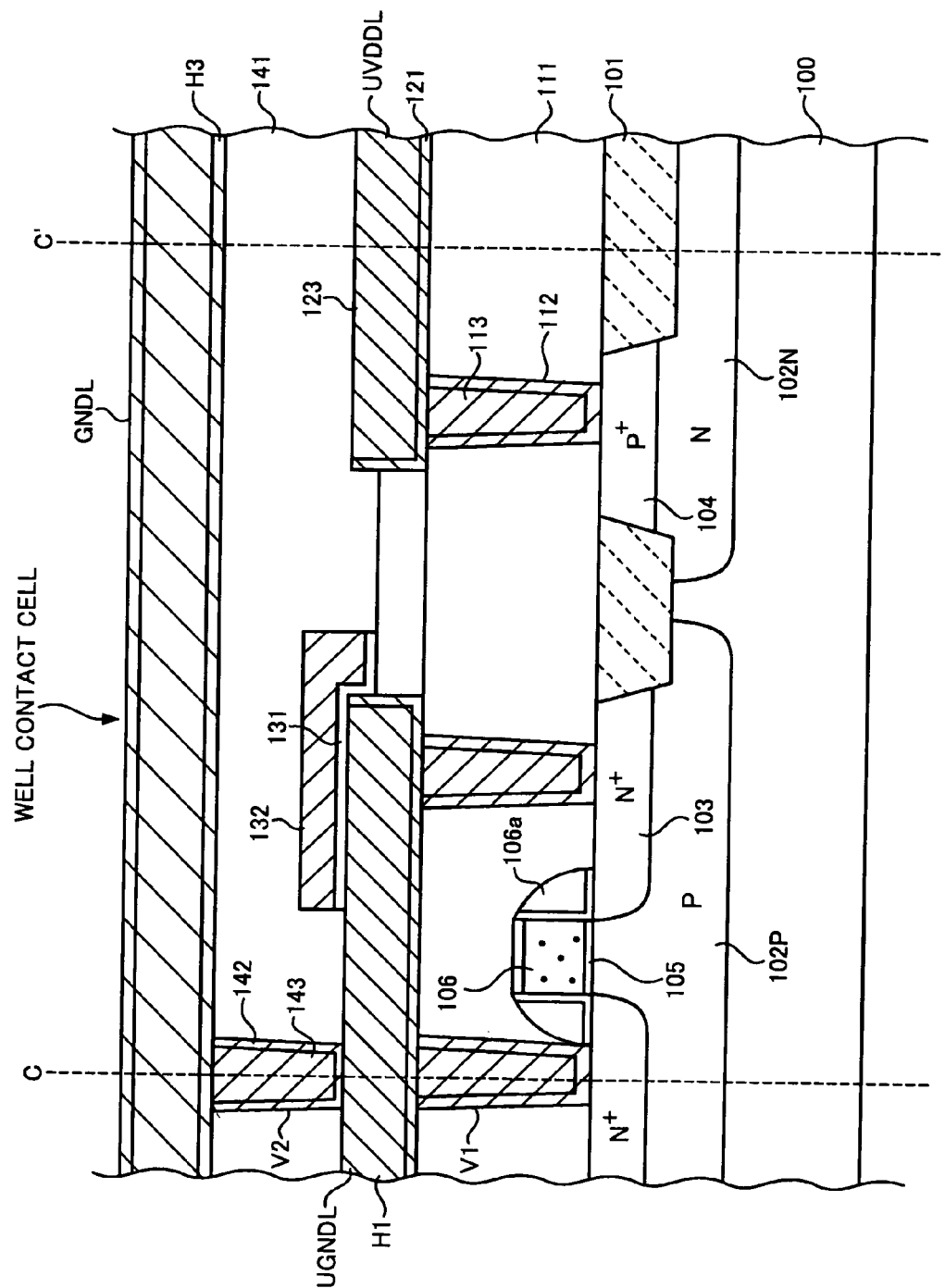
FIG. 11 is a sectional view taken along the line C-C' of FIG. 8.
Figure 12:
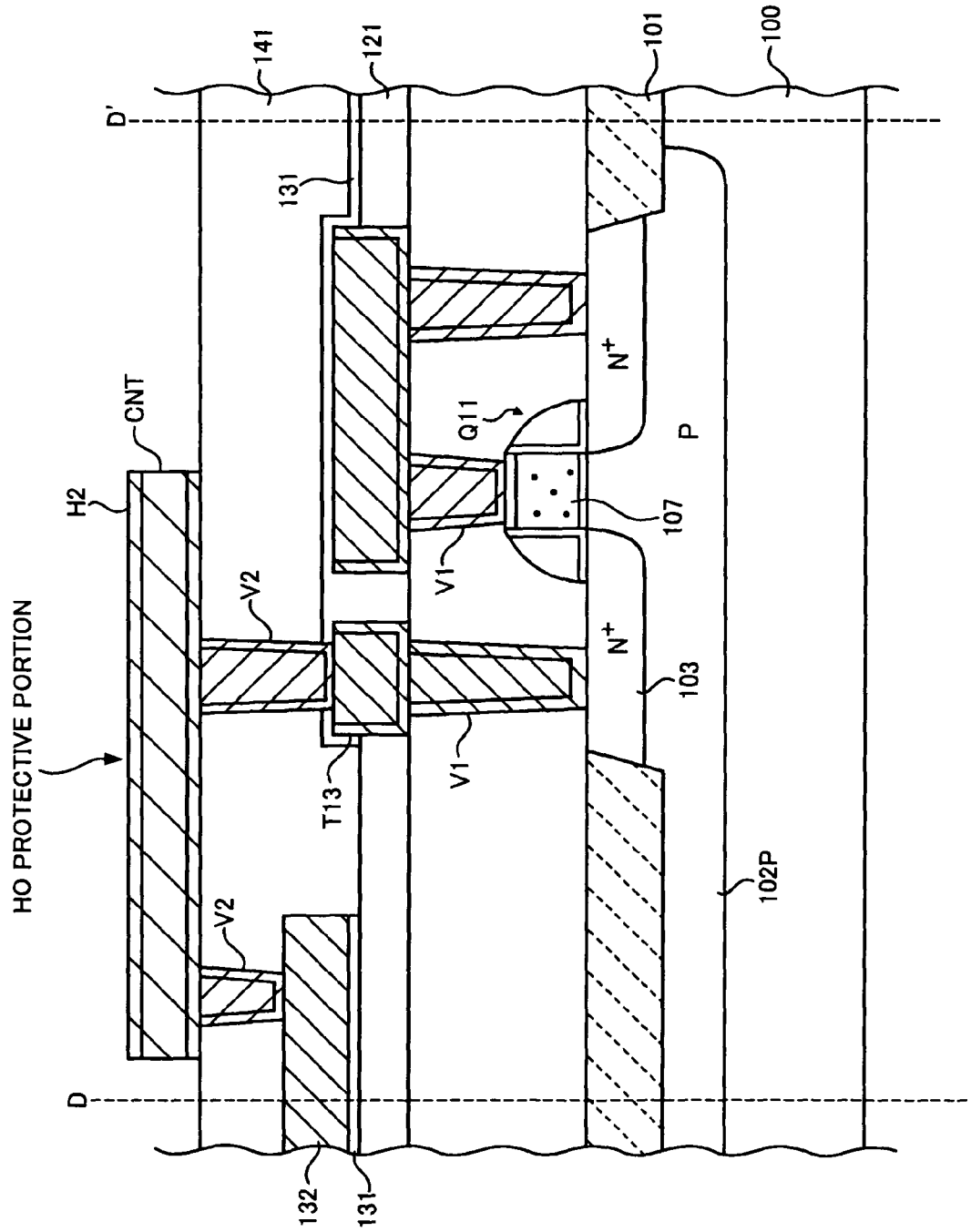
FIG. 12 is a sectional view taken along the line D-D' of FIG. 8.

FIG. 8 is a plan view showing a third wiring layer. The third wiring layer H3 forms the digit lines DL1 and DL2 in the memory cell MC. Further, the third wiring layer H3 forms the power supply line VDDL, the ground line GNDL, and a relay electrode T3 in the well contact cell TU. Incidentally, the relay electrode T3 is connected with an illustrated upper metal word line. These wiring lines are electrically connected with a lower wiring line via the second via hole V2. For example, in the memory cell MC, the digit lines DL1 and DL2 are connected with drain terminals of the transfer transistors Q5 and Q6 through the second via hole V2, the relay electrode T11, and the first via hole V1. In the protective portion HO, the third wiring layer H3 forms a protective element connecting wiring line CNT for connecting the upper capacitance electrode 132 and the drain of the MOS transistor Q11. The protective element connecting wiring line CNT is connected with the upper capacitance electrode 132 and the drain of the MOS transistor Q11 via the second via hole V2. The structure of FIG. 8 is described with reference to sectional views of FIGS. 9 to 12. The third wiring layer H3 having a multilayer structure of TiN/Al (aluminum)/TiN is formed into a desired pattern on the third interlayer insulating film 141. The power supply line VDDL is connected with source terminals of the load transistors Q1 and Q2 through the second via hole V2, the lower power supply line UVDDL, and the first via hole V1. The ground line GNDL is connected with source terminals of the driving transistors Q3 and Q4 through the second via hole V2, the lower ground line UGNDL, and the first via hole V1. The relay electrode T3 of the third wiring layer H3 is connected with the word line WL through the second via hole V2, the relay electrode T11, and the first via hole V1. Incidentally, the word line WL is connected with an upper metal word line MWL to reduce a resistance value thereof. In the protective portion HO, one end of the protective element connecting wiring line CNT is connected with the upper capacitance electrode 132 through the second via hole V2, and the other end thereof is connected with the drain of the MOS transistor Q11 through the second via hole V2, the relay electrode T13, and the first via hole V1.

In the thus-configured SRAM, the capacitors C1 to C4 are formed by use of the first wiring layer H1, that is, node wiring lines N1 and N2, the lower ground line UGNDL, and the lower power supply line UVDDL, and besides, the capacitance insulating film 131 covering the upper surface and upper side surface of these wiring lines, and the upper capacitance electrode 132 as the second wiring layer H2 formed on the capacitance insulating film 131. Then, the capacitors C1 and C2 provided between the node wiring lines N1 and N2 and the upper capacitance electrode 132 are series-connected with the capacitors C3 and C4 provided between the lower ground line UGNDL and the lower power supply line UVDDL through the same upper capacitance electrode 132. In addition, the capacitors C1 and C2 series-connected with the capacitors C3 and C4 are further connected with the ground GND or the power supply VDD via the capacitors C3 or C4. In short, each of the capacitors C1 to C4 is parallel-connected with the node wiring lines N1 and N2 connected with source terminals of both the driving transistors Q3 and Q4. For example, the first wiring layer H1 forming the capacitor C1 and the node wiring line N1 is connected with the power supply VDD via the load transistor Q1 and connected with the power supply VDD via the capacitors C1 and C4. In addition, the upper capacitance electrode 132 as the node N3 shared among the capacitors C1 to C4 is connected with the drain of the MOS transistor Q11. At the same time, the upper capacitance electrode 132 as the node N3 shared among the capacitors C1 to C4 is connected with the lower ground line UGNDL via the MOS transistor Q11.

Referring to FIG. 1, as mentioned above, the capacitors C1 and C3 are connected between the node wiring line N1 and the ground GND, and the capacitors C1 and C4 are connected between the node wiring line N1 and the power supply VDD. Further, the capacitors C2 and C3 are connected between the node wiring line N2 and the ground GND, and the capacitors C2 and C4 are connected between the node wiring line N2 and the power supply VDD. In addition, the capacitors C1 and C2 are connected between the node wiring lines N1 and N2. A pair of electron and hole are generated through the application of α line in the silicon substrate, and the electron (negative charge) and the hole (positive charge) influence data stored in the memory cell. Accordingly, the electron and hole generated through the application of the α line would incur a soft error. However, with the above structure, the capacitors C1 to C4 connected between the node wiring lines N1 and N2, and the ground GND and the power supply VDD increase a capacitance to thereby improve the soft-error resistance. Further, in this embodiment, an inter-node capacitance resulting from the capacitors C1 and C2 connected between the node wiring lines N1 and N2 further improves the soft-error resistance. Further, it is unnecessary to form the pair of node wiring lines N1 and N2 in two layers unlike the technique of Japanese Unexamined Patent Publication No. 10-163440, and these wiring lines can be formed in a single layer. Thus, there is no need to adopt a complicated manufacturing process for node wiring lines.

Further, in the embodiment, the second wiring layer H2 forming the upper capacitance electrode of the capacitors C1 to C4 is formed almost throughout the memory cell MC including the lower ground line UGNDL and lower power supply line UVDDL as well as the node wiring lines N1 and N2. Moreover, the upper surface of the second wiring layer H2 is flattened, so the upper third interlayer insulating film 141 and the third wiring layer H3 formed thereon can obtain the flat surfaces almost throughout the memory cell MC. Hence, any disconnection that would occur upon the formation of the insulating film or wring lines can be prevented. Therefore, as compared with the structure of Non-Patent Document 1 in which plural upper capacitance electrodes are arranged in one memory cell, the total length of the upper capacitance electrode extending to the peripheral portion can be reduce, and a difference in height from the peripheral portion can be reduced. In addition, the upper capacitance electrode is preferably in a floating state, a state of being connected with the power supply, or a grounded state. Moreover, if the upper capacitance electrode is in a floating state, it is preferable that a protective element be connected between the upper capacitance electrode in the floating state and the power supply line or ground line.

Moreover, if the SRAM is charged due to the CDM test, the second wiring layer H2 as the upper capacitance electrode 132 may be charged. However, in the above structure, the upper capacitance electrode 132, that is, the node N3 of FIG. 1 is connected with the MOS transistor Q11 as the protective element of the protective portion HO, so charges accumulated in the second wiring layer H2 flow through the lower ground line UGNDL via the MOS transistor Q11. Accordingly, it is possible to prevent the breakdown of the capacitance insulating film due to the discharge between the upper capacitance electrode 132 and the node wiring lines N1 and N2 underlying the upper capacitance electrode or the lower ground line UGNDL. Hence, the upper capacitance electrode 132 is prevented from being short-circuited with the node wiring lines N1 and N2 or the lower ground line UGNDL to ensure a sufficient node capacitance and high soft-error resistance.

In the first embodiment, the upper capacitance electrode 132 as the second wiring layer H2 is formed over the node wiring lines N1 and N2, the lower ground line UGNDL, and the lower power supply lines UVDDL. However, as regards the lower ground line UGNDL and the lower power supply line UVDDL, the upper capacitance electrode may be formed over at least the lower ground line UGNDL. Even this structure can increase a node capacitance as compared with the structure of the related art in which the electrode is merely formed over the node wiring lines.

Further, in the first embodiment, the upper capacitance electrode 132 is formed over the lower ground line UGNDL and the lower power supply line UVDDL, making it possible to extend the upper capacitance electrode 132 up to an adjacent memory cell. Particularly in the case of miniaturizing a memory cell, it is unnecessary to use a finer mask pattern for forming the upper capacitance electrode 132. Therefore, a mask design is facilitated, and the upper capacitance electrode can be easily manufactured.

Figure 3B:
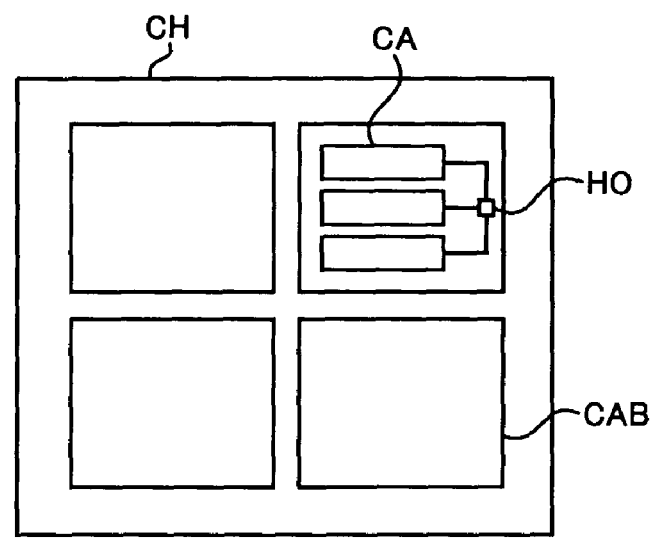
FIG. 3B shows another layout example of the overall semiconductor chip including the SRAM according to the embodiment of the present invention.

In the first embodiment, the protective elements are formed for each cell array CA, but as shown in FIG. 3B, one protective portion HO may be shared among the plural cell arrays CA. In this case, a capacitance electrode may be mutually provided for the plural cell arrays CA and electrically connected with the protective portion HO. Further, protective portions may be provided on both sides of the cell array CA. Incidentally, if the upper capacitance electrode would be negatively charged, the protective portion may be provided between the cell array and the power supply line. That is, protective element may be provided between the upper capacitance electrode 132 and the power supply line The first embodiment describes an example of applying the capacitor of the present invention to the SRAM, but the present invention is applicable to any capacitor of a semiconductor integrated circuit device besides the SRAM. That is, the lower capacitance electrode composed of a lower wiring line connected with a circuit element of the semiconductor integrated circuit device constitutes a part of the capacitor, and the lower capacitance electrode has only to include at least one of the power supply line and ground line composed of a lower wiring line. According to the semiconductor integrated circuit device of the present invention, a capacitor is formed using the upper and side surfaces of the lower capacitance electrode composed of the lower wiring line, and the power supply line or ground line is used as the lower capacitance electrode to increase the capacitor capacitance. Further, the upper capacitance electrode can extend over the power supply line or ground line and thus can be throughout the circuit element. A difference in height resulting from the upper capacitance electrode is minimized to obtain the flat surface and ensure the flat surface of the upper wiring layer formed thereon. Thus, the upper wiring layer can be formed with reliability. In the case of applying the semiconductor integrated circuit device of the present invention to the SRAM, not only the node wiring line but also the lower power supply line or lower ground line can be used as the lower capacitance electrode, whereby the node capacitance can be increased to increase charges for storing data and improve a resistance to a soft-error due to the application of the a line even if a cell size of the SRAM and a wiring line width are reduced.

It is apparent that the present invention is not limited to the above embodiment that may be modified and changed without departing from the scope and spirit of the invention.

What is claimed is:

1. A semiconductor integrated circuit device, comprising:
a circuit element formed on a semiconductor substrate; and
a plurality of capacitors formed on the semiconductor substrate, wherein each of the plurality of capacitors includes:
  at least two lower capacitance electrodes comprising a wiring line connected to the circuit element;
  a capacitance insulating film covering the wiling line; and
  an upper capacitance electrode formed on the capacitance insulating film,
wherein a first of the at least two lower capacitance electrodes includes a power supply line,
wherein a second of the at least two lower capacitance electrodes includes a ground line,
wherein each of the at least two lower capacitance electrodes completely fills an opening formed within an interlayer insulating film formed on the semiconductor substrate and within the upper capacitance electrode below the capacitance insulating film,
wherein the upper capacitance electrode completely fills a recess formed between the at least two openings, above the capacitance insulating film, and
wherein the wherein the circuit element comprises a memory cell of a Static Random Access Memory (SRAM), and the SRAM includes a pair of driving transistors of which at least gates and drains are cross-connected by use of a pair of node wiring lines,
wherein the plurality of capacitors include a pair of capacitors each connected with the pair of node wiring lines, and
wherein at least one of the at least two lower capacitance electrodes includes one of the pair of node wiring lines and at least one of the ground line and the power supply line.

2. The semiconductor integrated circuit device according to claim 1, wherein an upper surface and at least a part of a side surface of the at least two lower capacitance electrodes are exposed from the interlayer insulating film,
wherein the capacitance insulating film covers an exposed surface of the at least two lower capacitance electrodes that are exposed from the interlayer insulating film,
wherein at least a part of the upper capacitance electrode opposes the exposed surface of the at least two lower capacitance electrodes, and
wherein an entire upper surface of the upper capacitance electrode is flat.

3. The semiconductor integrated circuit device according to claim 1, wherein the SRAM includes six transistors comprising:
a pair of transfer transistors each connected between the pair of node wiring lines and a pair of digit lines; and
a pair of load transistors each connected with the pair of driving transistors.

4. The semiconductor integrated circuit device according to claim 1, wherein the upper capacitance electrode covers the pair of node wiring lines and at least one of the ground line and the power supply line.

5. The semiconductor integrated circuit device according to claim 4, wherein the upper capacitance electrode is in at least one of a floating state, a state of being connected with a power supply potential, and a grounded state.

6. The semiconductor integrated circuit device according to claim 4, wherein the upper capacitance electrode is in a floating state, and a protective element is connected between the upper capacitance electrode and a power supply line or a ground line.

7. The semiconductor integrated circuit device according to claim 6, wherein the protective element comprises a MOS transistor, a bipolar transistor, or a diode formed together with the transfer transistors, the driving transistors, and the load transistors.

8. The semiconductor integrated circuit device according to claim 6, wherein the SRAM includes at least one memory cell, and a well contact cell for electrically connecting the memory cell with a power supply line and a ground line formed of another wiring line, and
wherein the protective element is provided on at least one side of a memory cell line where the memory cell and the well contact cell are arranged in one direction.

9. The semiconductor integrated circuit device according to claim 8, wherein the protective element is connected with one memory cell line in a one-to-one correspondence.

10. The semiconductor integrated circuit device according to claim 8, wherein the protective element is commonly connected with a plurality of memory cell lines.

11. The semiconductor integrated circuit device according to claim 6, wherein a first wiring layer including the wiring line, a second wiring layer, and a third wiring layer are layered in order on a transistor in the memory cell,
wherein the first wiring layer forms the node wiring lines, the lower power supply line, and the lower ground line,
wherein the second wiring layer forms the upper capacitance electrode, and
wherein the third wiring layer forms the another wiring line.

12. The semiconductor integrated circuit device according to claim 1, wherein the upper capacitance electrode is formed over a memory cell region except a portion for electrical connection with another wiring line.

13. The semiconductor integrated circuit device according to claim 1, wherein a plurality of memory cells are arranged on the semiconductor substrate as the memory cell, and
wherein the upper capacitance electrode extends up to an adjacent memory cell.

14. The semiconductor integrated circuit device according to claim 1, wherein the SRAM includes at least one memory cell, and a well contact cell for electrically connecting the memory cell with a power supply line and a ground line formed of another wiring line, and
wherein the lower power supply line and the lower ground line extend up to the well contact cell, and are electrically connected with the power supply line and the ground line respectively in the well contact cell.

15. The semiconductor integrated circuit device according to claim 1, wherein the capacitance insulating film covers an upper surface and a side surface of the wiring line, and
wherein the wiring line includes a barrier film formed on a surface of the opening and an conductive layer formed on the barrier film,
wherein in said recess formed between the at least two openings, the capacitance insulating film is sandwiched between the upper capacitance electrode and the interlayer insulating film,
wherein in said side surface of the wiring line, the capacitance insulating film is sandwiched between the upper capacitance electrode and the barrier film, and
wherein in an upper surface of the wiring line, the capacitance insulating film is sandwiched between the upper capacitance electrode and the wiring line.

16. The semiconductor integrated circuit device according to claim 1, wherein the plurality of capacitors are configured to resist soft-errors.

17. The semiconductor integrated circuit device according to claim 1, wherein each of the least two lower capacitance electrodes is supplied with a fixed potential.

* * * * *